(12) United States Patent
Xie et al.

(10) Patent No.: US 12,464,813 B2
(45) Date of Patent: Nov. 4, 2025

(54) SEMICONDUCTOR DEVICE HAVING HYBRID MIDDLE OF LINE CONTACTS

(71) Applicant: International Business Machines Corporation, Armonk, NY (US)

(72) Inventors: Ruilong Xie, Niskayuna, NY (US); Su Chen Fan, Cohoes, NY (US); Veeraraghavan S. Basker, Schenectady, NY (US); Julien Frougier, Albany, NY (US); Nicolas Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 779 days.

(21) Appl. No.: 17/504,765

(22) Filed: Oct. 19, 2021

(65) Prior Publication Data
US 2023/0124681 A1   Apr. 20, 2023

(51) Int. Cl.
*H01L 27/092* (2006.01)
*H10D 30/67* (2025.01)
(Continued)

(52) U.S. Cl.
CPC ......... *H10D 84/85* (2025.01); *H10D 30/6735* (2025.01); *H10D 30/6757* (2025.01);
(Continued)

(58) Field of Classification Search
CPC ............... H10D 84/85; H10D 30/6735; H10D 30/6757; H10D 62/118; H10D 64/258;
(Continued)

(56) References Cited

U.S. PATENT DOCUMENTS

| 9,006,100 B2 | 4/2015 | Rashed |
| 9,614,056 B2 | 4/2017 | Xie |

(Continued)

FOREIGN PATENT DOCUMENTS

| WO | 2016200971 A1 | 12/2016 |
| WO | 2021075540 A1 | 4/2021 |
| WO | 2023/066793 A1 | 4/2023 |

OTHER PUBLICATIONS

Guo et al., "Standard cell architectures for N2 node: transition from FinFET to NanoSheet and to ForkSheet device", 6 pps., © 2020 IEEE, <https://www.researchgate.net/publication/340111847_Standard_cell_architectures_for_N2_node_transition_from_FinFET_to_nanosheet_and_to_forksheet_device>.

(Continued)

*Primary Examiner* — Mohammed R Alam
(74) *Attorney, Agent, or Firm* — David K. Mattheis

(57) ABSTRACT

A CMOS (complementary metal-oxide semiconductor) device includes an n-channel metal-oxide semiconductor (NMOS) device, a p-channel metal-oxide semiconductor (PMOS) device, the NMOS and the PMOS device surrounded by a first dielectric material, the NMOS device separated from the PMOS device by a second dielectric material, a first NMOS gate separated from a first PMOS gate by the second dielectric material, a second NMOS gate electrically connected to a second PMOS gate by a metal link disposed between the NMOS gate and the PMOS gate, the metal link disposed above the second dielectric material, a first source/drain (S/D) contact disposed above the second dielectric material, the first S/D contact disposed in contact with both NMOS S/D region and a PMOS S/D region, and a second S/D contact disposed adjacent to the second dielectric material, the second S/D contact disposed in contact with a single S/D region.

13 Claims, 11 Drawing Sheets

(51) Int. Cl.
   *H10D 62/10* (2025.01)
   *H10D 64/23* (2025.01)
   *H10D 84/01* (2025.01)
   *H10D 84/03* (2025.01)
   *H10D 84/85* (2025.01)

(52) U.S. Cl.
   CPC ......... *H10D 62/118* (2025.01); *H10D 64/258* (2025.01); *H10D 84/0186* (2025.01); *H10D 84/038* (2025.01)

(58) Field of Classification Search
   CPC ............. H10D 84/0186; H10D 84/038; H10D 30/014; H10D 30/43; H10D 62/121; H10D 62/126; H10D 84/0188; B82Y 10/00
   See application file for complete search history.

(56) References Cited

U.S. PATENT DOCUMENTS

| | | | |
|---|---|---|---|
| 9,997,598 B2 | 6/2018 | Smith | |
| 10,998,314 B2 | 5/2021 | Bergendahl | |
| 2008/0087966 A1* | 4/2008 | Tai | H10D 84/038 257/E21.632 |
| 2020/0020795 A1 | 1/2020 | Bao | |
| 2020/0075421 A1 | 3/2020 | Wu et al. | |
| 2020/0328106 A1 | 10/2020 | Ku | |
| 2021/0296315 A1 | 9/2021 | Lilak et al. | |
| 2022/0416032 A1* | 12/2022 | Nandi | H10D 30/43 |

OTHER PUBLICATIONS

"Patent Cooperation Treaty PCT Notification of Transmittal of the International Search Report and the Written Opinion of the International Searching Authority, or the Declaration", Applicant's file reference P202100130PCT01, International Application No. PCT/EP2022/078602, International Filing Date Oct. 14, 2022, Date of Mailing Jan. 20, 2023, 16 pgs.

Speddot et al., "Device Scaling roadmap and its implecations for Logic and Analog platform", 2020 IEEE BiCMOS and Compound Semiconductor Integrated Circuits and Technology Symposium (BCICTS) 978-1-7281-9749—Apr. 20, 2020 IEEE, DOI: 10.109/BCICTS, 8 PGS.

Guo, et al., Balancing Efficiency and Flexibility for DNN Acceleration via Temporal GPU-Systolic Array Integration, arXiv:2002.08326, Feb. 18, 2020, 6 pages.

* cited by examiner

SEMICONDUCTOR DEVICE HAVING HYBRID MIDDLE OF LINE CONTACTS

BACKGROUND

The disclosure relates generally to complementary metal-oxide semiconductor (CMOS) devices. The disclosure relates particularly to CMOS device having hybrid middle of line (MOL) contacts.

CMOS devices include separated pairs of NMOS (n-channel metal-oxide semiconductor) and PMOS (p-channel metal-oxide semiconductor) devices including common source/drain and gate contacts as well as independent source/drain and gate contacts.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a CMOS (complementary metal-oxide semiconductor) device includes an n-channel metal-oxide semiconductor (NMOS) device, a p-channel metal-oxide semiconductor (PMOS) device, the NMOS and the PMOS device surrounded by a first dielectric material, the NMOS device separated from the PMOS device by a second dielectric material, a first NMOS gate separated from a first PMOS gate by the second dielectric material, a second NMOS gate electrically connected to a second PMOS gate by a metal link disposed between the NMOS gate and the PMOS gate, the metal link disposed above the second dielectric material, a first source/drain (S/D) contact disposed above the second dielectric material, the first S/D contact disposed in contact with both NMOS S/D region and a PMOS S/D region, and a second S/D contact disposed adjacent to the second dielectric material, the second S/D contact disposed in contact with a single S/D region.

In one aspect, a method of fabricating a CMOS (complementary metal-oxide semiconductor) device includes forming a first cut between an n-channel metal-oxide semiconductor (NMOS) device and a p-channel metal-oxide semiconductor (PMOS) device, the NMOS device and PMOS device encapsulated by a first dielectric material, filling the first cut with a second dielectric material, forming a first contact opening through the first dielectric material and the second dielectric material exposing device source/drain regions, forming a second contact opening through a portion of the first dielectric material, preserving the second dielectric material and exposing device source/drain regions, forming a third contact opening through a portion of the second dielectric material, exposing device gate contacts, and forming metal contacts in the first, second, and third contact openings.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
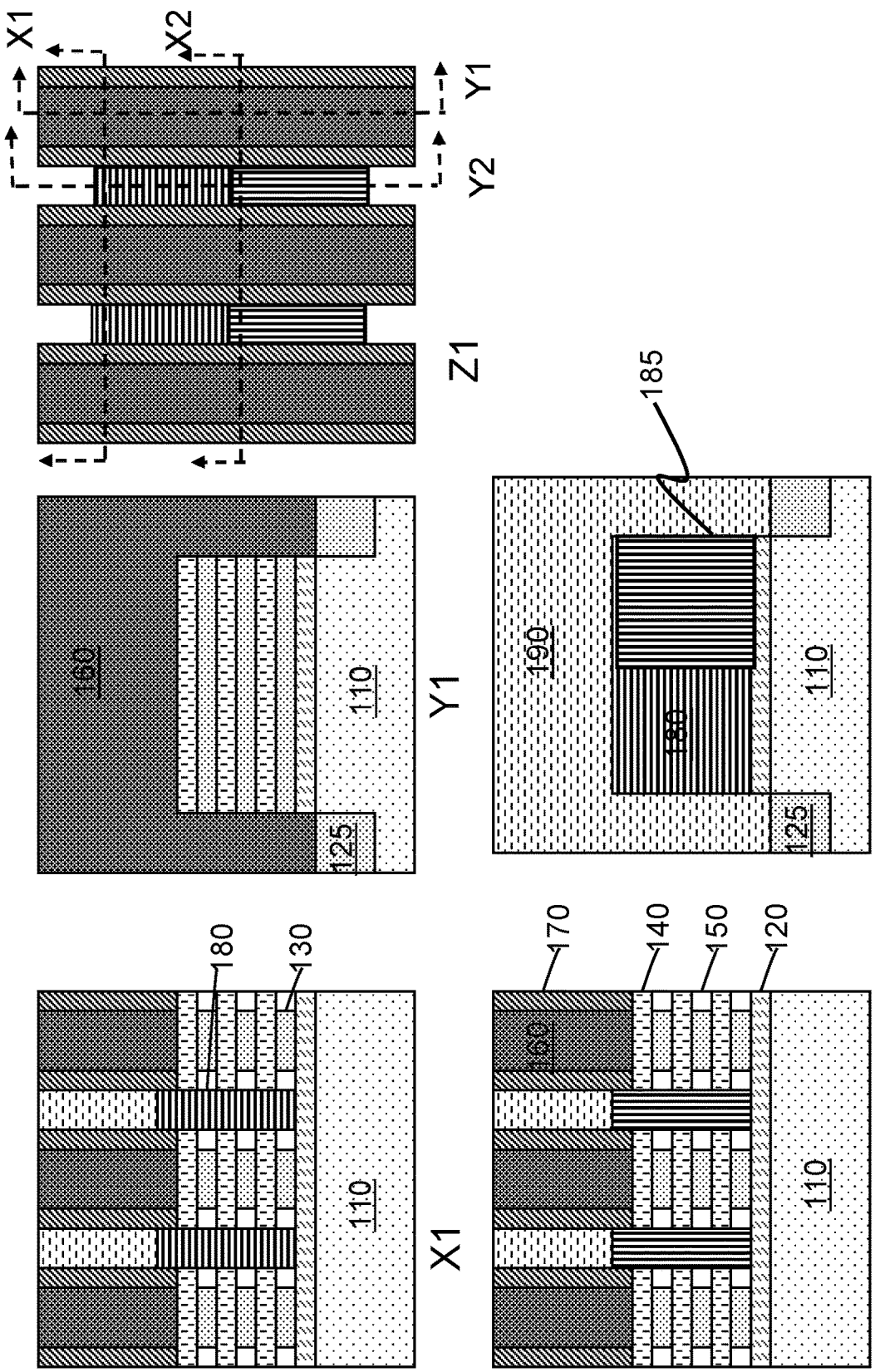
FIG. 1 provides cross-sectional views of a step in the fabrication of a semiconductor device, according to an embodiment of the invention. The figure illustrates the device after formation of device dummy gate structures, nanosheet inner spacers and epitaxial growth of device source/drain regions.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25 C. about 900 C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Downscaling of CMOS devices has progressed through stages where the number of PFET and NFET fins have been diminished and fins have evolved to nanosheet stacks. NFET to PFET spacing has also been diminished. In some designs NFET to PFET spacing has been reduced to about 16 nanometers. Such small spacing designs present challenges to reliably and consistently produce the NFET-PFET separation during fabrication. Disclosed embodiments provide structures and fabrication methods which reliably provide small NFET to PFET spacings.

Disclosed embodiments include CMOS structures having a dielectric spacer formed in a global cut made between the NMOS and PMOS devices, the dielectric spacer separating some of the NMOS and PMOS gate contacts of the device. The device also includes NMOS and PMOS gate contacts electrically joined through the formation of a metal gate contact link disposed between the NMOS and PMOS gates in a cut through an upper portion of the dielectric spacer between the gates. The device also includes NMOS and PMOS source/drain regions sharing a common S/D contact disposed across the S/D regions, above the recessed dielectric spacer between the NMOS and PMOS S/D regions. The device also includes NMOS and PMOS S/D regions having independent S/D contacts, where the dielectric spacer is not recessed and as tall as top surface of the S/D contacts.

Embodiments include fabrication methods including formation of a global cut separating the NMOS and PMOS S/D regions and through the dummy gate structures of the device. Formation of replacement metal gates follows deposition of the dielectric spacer between the NMOS and PMOS devices. The dielectric spacer comprises a dielectric material which differs from that of the interlayer dielectric material used in fabricating the devices. A series of contact openings are made across the fins of the device. A first contact opening removes both the ILD material and the spacer dielectric material, exposing the NMOS and PMOS S/D regions. A second contact opening across the device removes only the ILD material, selective to the spacer dielectric material, exposing the NMOS and PMOS S/D regions while leaving the dielectric spacer between and above the S/D regions. A third contact opening removes a portion of the dielectric spacer between NMOS and PMOS gates. The three openings are subsequently filled with metal contacts resulting in common S/D contacts for the NMOS and PMOS devices, independent S/D contacts for the NMOS and PMOS devices, and common gate contacts for the NMOS and PMOS devices. The dielectric spacer also provides independent gate contacts for the NMOS and PMOS devices.

Reference is now made to the figures. The figures provide schematic cross-sectional illustration of semiconductor devices at intermediate stages of fabrication, according to one or more embodiments of the invention. The figures provide front cross-sections, X1, X2, parallel to the device fins and side cross-sections, Y1, Y2, Y3, and Y4, perpendicular to the fins and the front cross sections. The figures provide schematic representations of the devices of the invention and are not to be considered accurate or limiting with regards to device element scale. The Z1 views of the Figures do not illustrate the ILD layer of the device to provide increased visibility of other device elements.

FIG. 1 illustrates the device at an intermediate stage of fabrication. The Figure provides cross-sectional views X1, X2, Y1, and Y2. The Figure illustrates the device following fabrication of individual dummy gate structures including nanosheet stacks with sacrificial nanosheet layers 130, nanosheet semiconductor channels 140, inner spacers 150, dummy gates 160, and gate sidewall spacers 170. The dummy gate structures are disposed above bottom dielectric isolation layer 120. The Figure further illustrates device PMOS and NMOS source/drain regions 180, 185, epitaxially grown between adjacent dummy gate structures and covered by interlayer dielectric (ILD) material 190. Fabrication steps necessary to yield the illustrated structures follow known fabrication methods.

The nanosheet stacks include a bottom-most sacrificial layer 130 of a first semiconductor material, such as SiGe and alternating layers of a second semiconductor material, such as Si. The nanosheet stack is depicted with six layers (three SiGe layers and three Si layers forming a device). However, any number and combination of layers can be used so long as the layers alternate between SiGe and Si. Formation of bottom dielectric isolation (BDI) layer 120 occurs after selective removal of a unique sacrificial layer having a Ge concentration level differentiating this layer from sacrificial layers 130 and enabling selective removal of this layer while leaving sacrificial layers 130 intact. In an embodiment, the PMOS and NMOS devices of the nanosheet stack have not been separated. The nanosheet stack is depicted with the layers being in the form of nanosheets, however the width of any given nanosheet layer can be varied so as to result in the form of a nanowire, etc. SiGe layers 130, can be composed of, for instance, $SiGe_{15-35}$, examples thereof including, but not limited to $SiGe_{15}$, $SiGe_{20}$, $SiGe_{25}$, . . . $SiGe_{35}$.

In an embodiment, gate sidewall spacers 170 and BDI layer 120 comprise insulative materials, such as $Si_3N_4$, SiBCN, SiNC, SiN, SiCO, $SiO_2$, SiNOC, etc. In an embodiment, dummy gates 160 comprise a polycrystalline silicon material. In an embodiment, there is a thin SiO2 layer separating the dummy gate from the nanosheet stack. ILD layer 190 comprises a material such as $SiO_2$, SiN, SiOC, and combinations of these. In an embodiment, inner spacers 150 consist of any suitable dielectric material, for example $Si_3N_4$, SiBCN, SiNC, SiN, SiCO, $SiO_2$, SiNOC, etc. The inner spacer is formed by a conformal dielectric liner deposition followed by isotropic etching back, so dielectric liner is removed everywhere except the regions pinched-off in those under spacer cavities. The Figure further illustrates shallow trench isolation regions 125 comprising materials such as silicon dioxide, or any suitable combination of multiple dielectric materials (e.g., silicon nitride and silicon oxide).

In an embodiment, epitaxial growth of the PMOS and NOMOS S/D regions 180, 185, proceeds sequentially. Following selectively recessing the nanosheets between dummy gates, and the formation of the inner spacers, a first source/drain epitaxial region is grown from the nanosheet edges between the dummy gates. This S/D region may be doped as either NMOS or PMOS, for this example, the region is doped as PMOS. Following trimming of the grown S/D region, deposition of a protective liner, such as SiN, over the exposed device surfaces, and the formation of a patterned organic planarization layer mask over around half of the S/D region, the masked portion representing the PMOS S/D region of the device, etching removes the exposed portion of the S/D region and protective liner. Epitaxial growth of a second doped S/D region, the NMOS for this example, occurs from the exposed nanosheet edges and from the exposed surface of the PMOS S/D region. The second S/D region is trimmed to the desired size and shape. Removal of the remaining OPL and protective liner layer follow growth and subsequent trimming of the NMOS S/D region. The resulting structure includes dual S/D regions having both NMOS and PMOS portions. The dual portions have an interface at or near the centerline of the device.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 180, 185 may be formed by in-situ doped epitaxy growth. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

The semiconductor substrate 110 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

Figure 2:
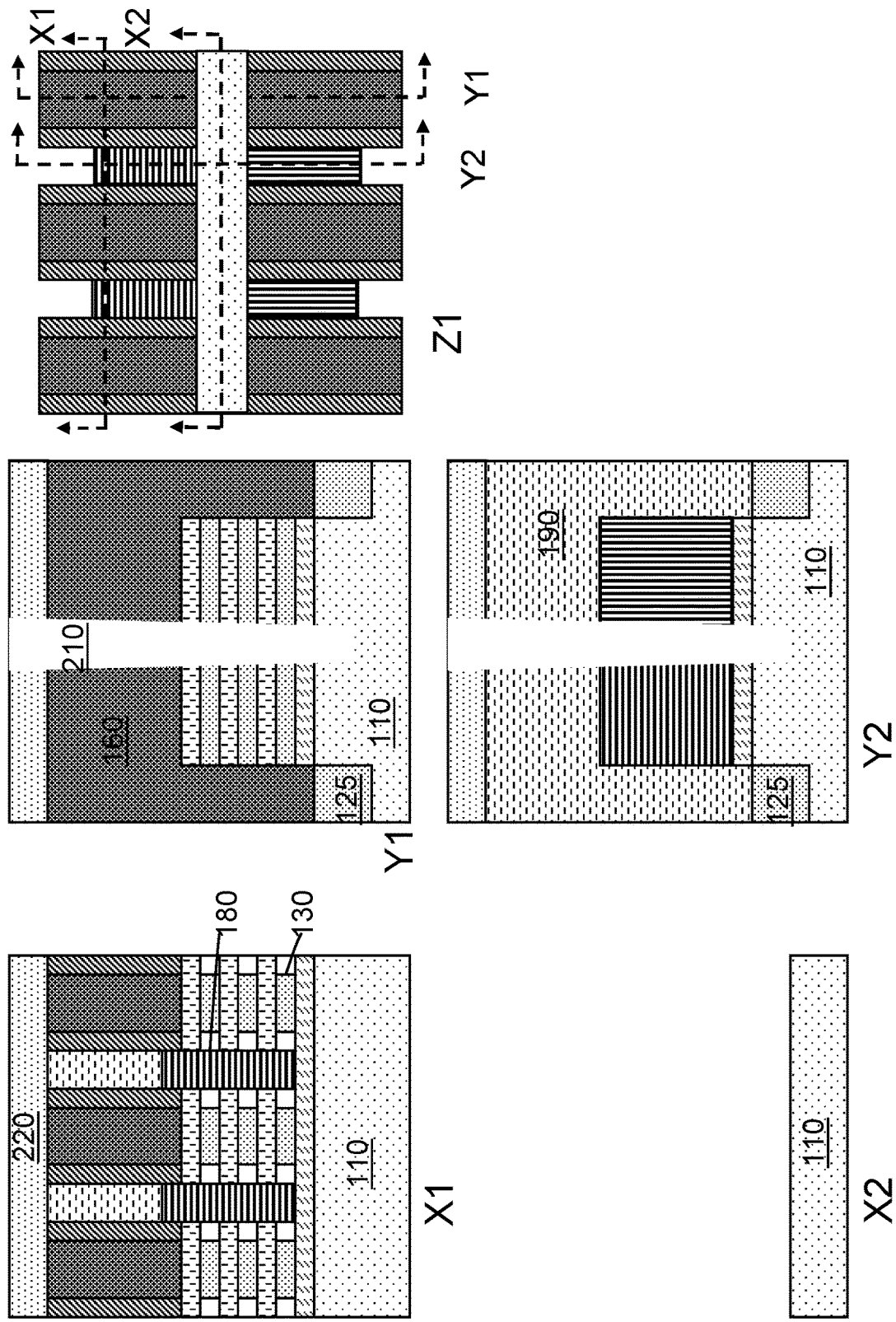
FIG. 2 provides cross-sectional views of a step in the fabrication of a semiconductor device, according to an embodiment of the invention. The figure illustrates the device after formation of the global cut between the NMOS and PMOS devices.
Figure 3:
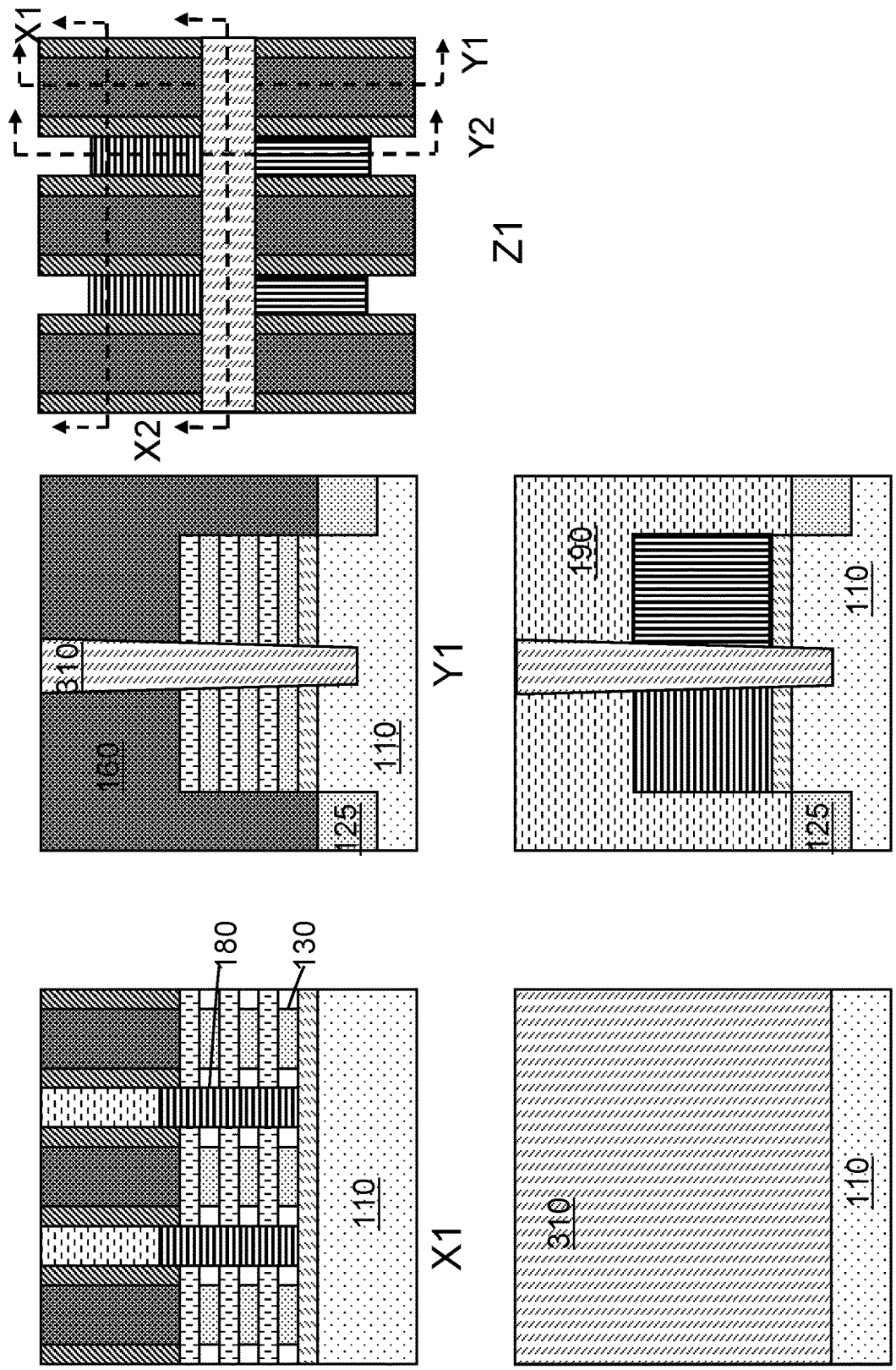
FIG. 3 provides cross-sectional views of a step in the fabrication of a semiconductor device, according to an embodiment of the invention. The figure illustrates the device after the formation of a dielectric spacer in the global cut between the NMOS and PMOS devices.

FIG. 2 illustrates the device following a patterning of a global cut 210, separating the PMOS and NMOS portions of the device along the interface between the NMOS and PMOS portions. As shown in the Figure, global cut 210, extends through all underlying materials, such as gates 160, spacer 170, ILD 190, nanosheets, inner spacer 150, S/D regions 180, 185, BDI 120, and portions of the substrate 110. The patterning process can be conventional lithography process using a softmask such as an organic planarization layer (OPL) 220. After lithographic exposure and OPL open, an anisotropic RIE process can be used to form the global cut/trench FIG. 3 illustrates the device following deposition of dielectric spacer 310 in the cut 210. Dielectric spacer 310 comprises a material such as SiBCN, SiC, SiN, SiOC, and combinations of these. The specific material of dielectric spacer 310 differs from the ILD material 190. Following deposition of dielectric spacer material 310, an etch back process or chemical mechanical planarization (CMP) processes are used to recess and polish the upper surface of the device.

Figure 4:
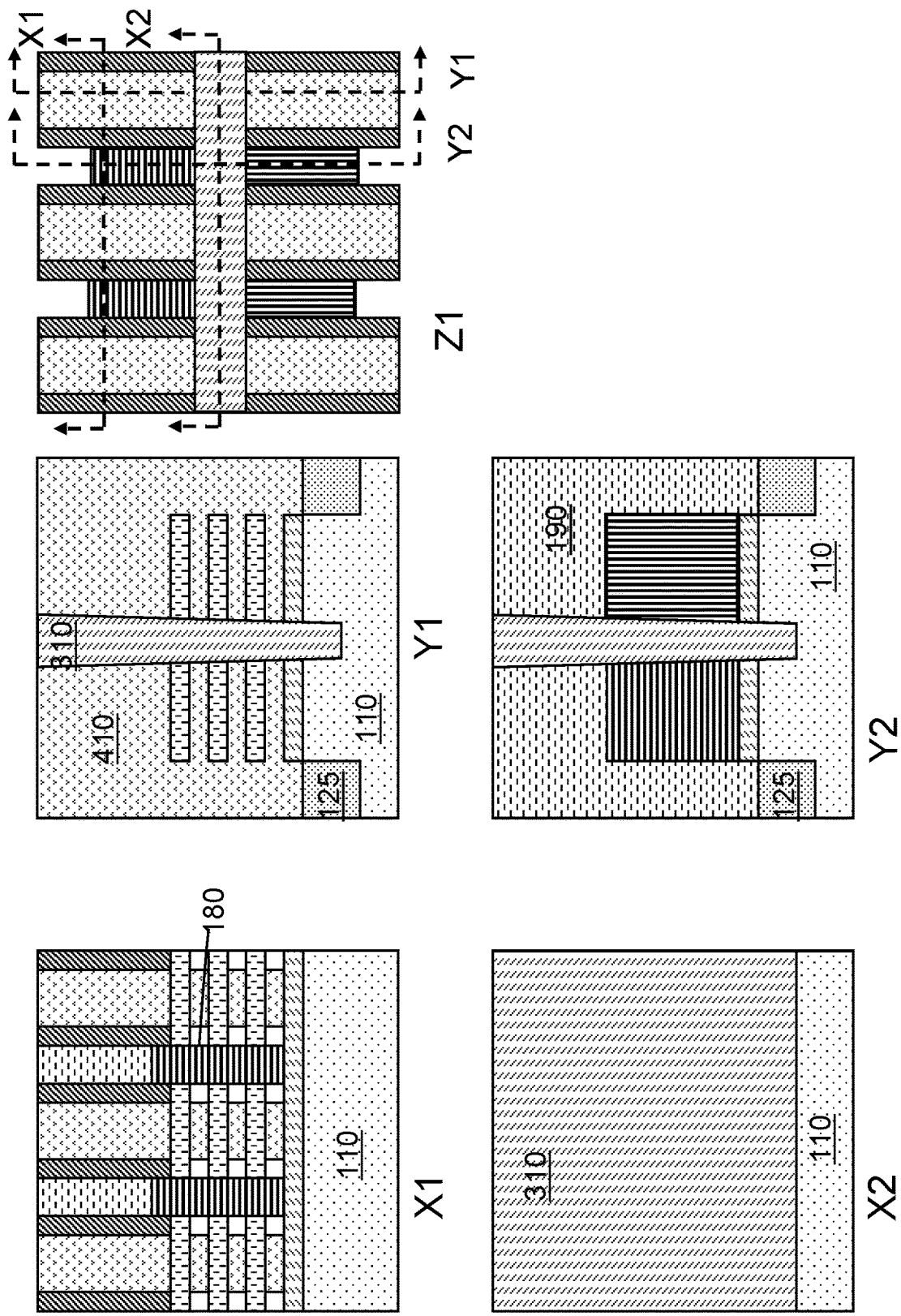
FIG. 4 provides cross-sectional views of a step in the fabrication of a semiconductor device, according to an embodiment of the invention. The figure illustrates the device after the replacement of dummy gates by high-k metal gates (HKMG).

FIG. 4 illustrates the device following the removal of dummy gate 160, sacrificial SiGe 130, and formation of the high-k metal gate (HKMG) stack 410. As shown in the Figure, a replacement metal gate structure has been formed in the void space created by removal of the dummy gate 160, and sacrificial SiGe 130. The gate structure 410 surrounds the nanosheet channels on three sides, forming a tri-gate structure. Gate structure 410 includes gate dielectric and gate metal layers (not shown). The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a chemical mechanical planarization (CMP) process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by a deposition and CMP of a gate cap dielectric material (not shown), such as SiN, or similar materials, completing the replacement metal gate fabrication stage for the device. Cross-section Y1 illustrates the separation of the NMOS and PMOS HKMG portions 410, of the device.

Figure 5:
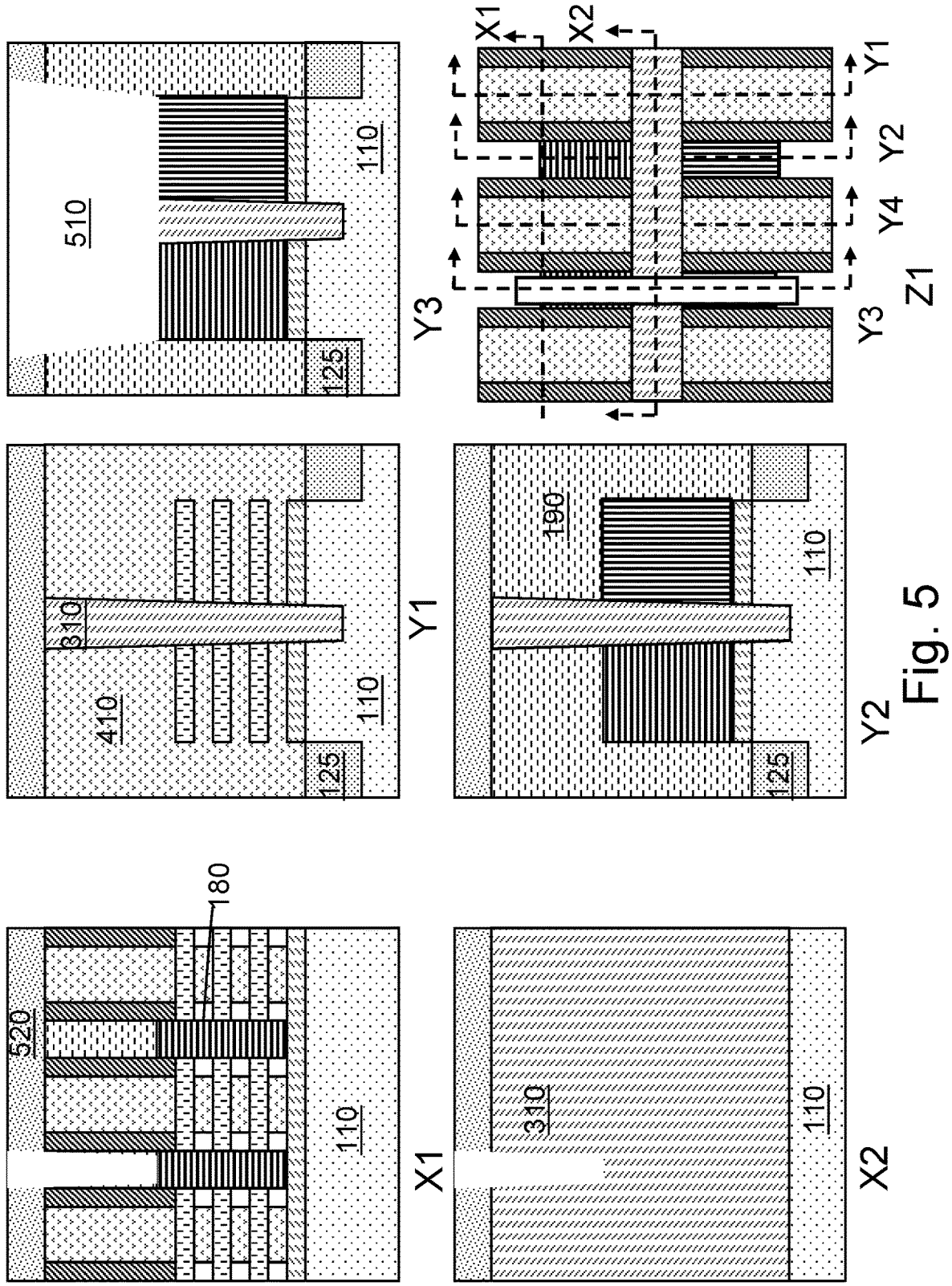
FIG. 5 provides cross-sectional views of a step in the fabrication of a semiconductor device, according to an embodiment of the invention. The figure illustrates the device after formation of a first contact opening through both an interlayer dielectric and the dielectric spacer in the global cut.

FIG. 5 illustrates the device following a non-selective reactive ion etching of a first type of contact opening 510, following deposition of an upper dielectric layer 520, such as SiO2, SiN, SiOC, and combinations of these. The RIE removes upper dielectric material 520, as well as ILD material 190, and dielectric spacer material 310. Contact opening 510, exposes NMOS and PMOS S/D portions at a common upper surface. As shown in FIG. 5 views Y3 and Z1, contact opening 510, passes through ILD material 520, as well as ILD material 190, and a portion of dielectric spacer material 310. This first contact opening exposes NMOS and PMOS S/D regions 180, 185, of the device. The NMOS and PMOS S/D regions remain separated by dielectric spacer material 310.

Figure 6:
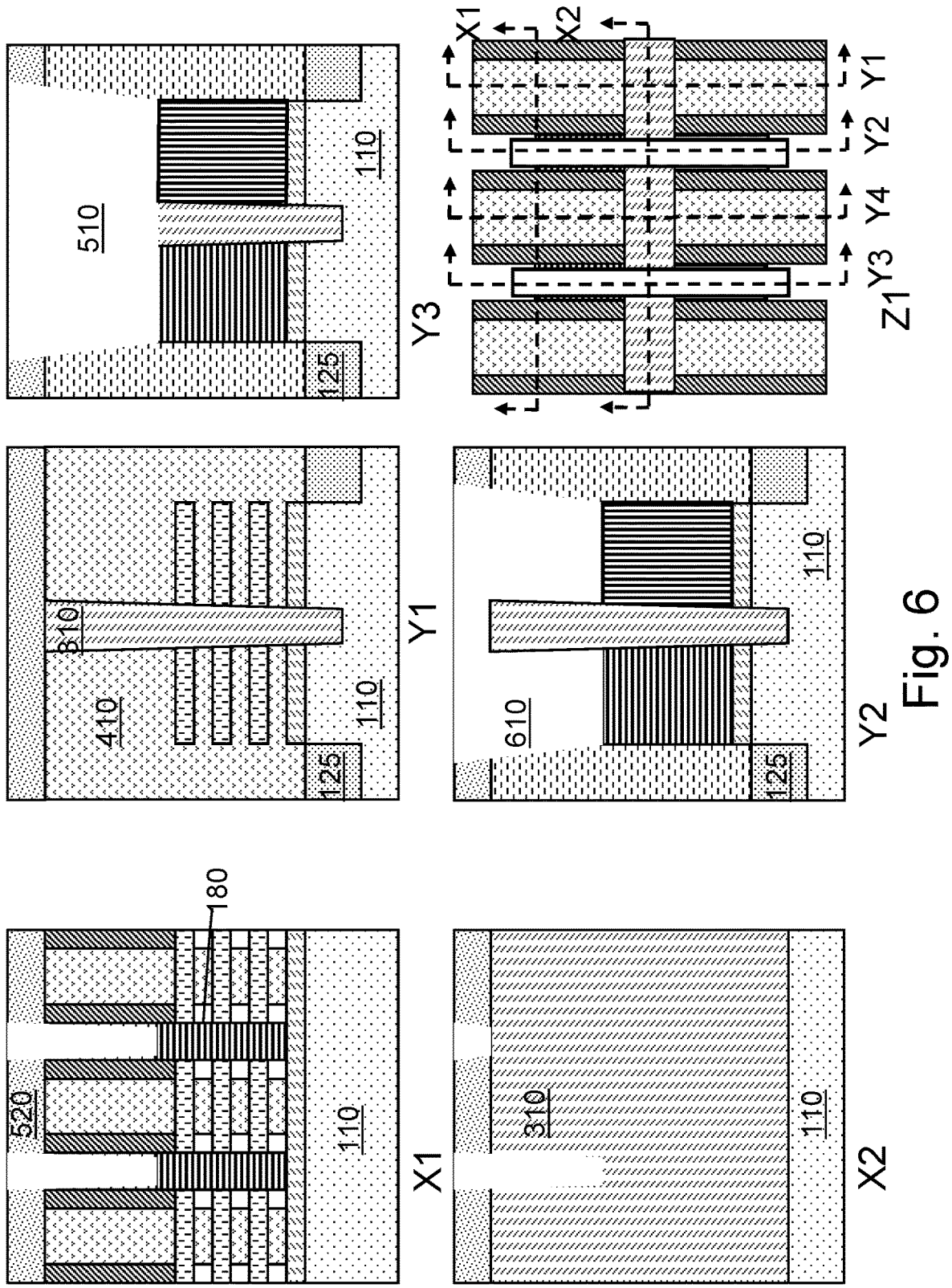
FIG. 6 provides cross-sectional views of a step in the fabrication of a semiconductor device, according to an embodiment of the invention. The figure illustrates the device after formation of a second contact opening through the interlayer dielectric while selectively preserving the dielectric spacer in the global cut.

FIG. 6 illustrates the device following formation of a second type of contact opening 610, using a self-aligned reactive ion etching process which selectively removes upper dielectric 520, and ILD material 190, while preserving dielectric spacer material 310. Contact opening 610 exposes upper surfaces of NMOS and PMOS S/D regions 180, 185. The S/D regions remain separated by the preserved lower portion of dielectric spacer 310.

Figure 7:
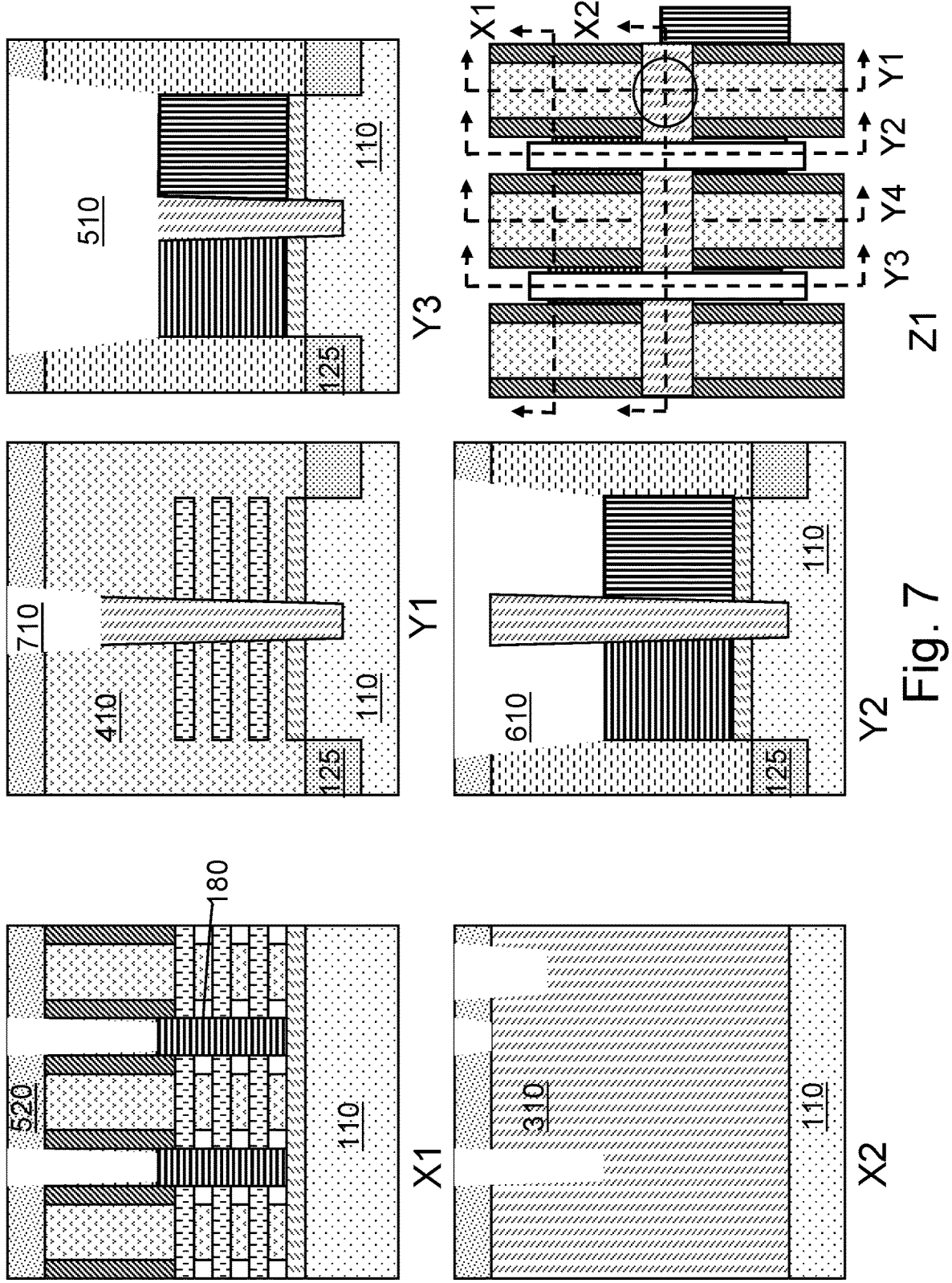
FIG. 7 provides cross-sectional views of a step in the fabrication of a semiconductor device, according to an embodiment of the invention. The figure illustrates the device after formation of a third contact opening through the dielectric spacer in the global cut between NMOS and PMOS device HKMG portions.

FIG. 7 illustrates the device following patterning and recessing of a portion of dielectric spacer 310, between HKMG portions 410, of the NMOS and PMOS portions of the device forming third contact opening 710. Contact opening 710, exposes portions of HKMG elements 410, of the NMOS and PMOS elements.

Figure 8:
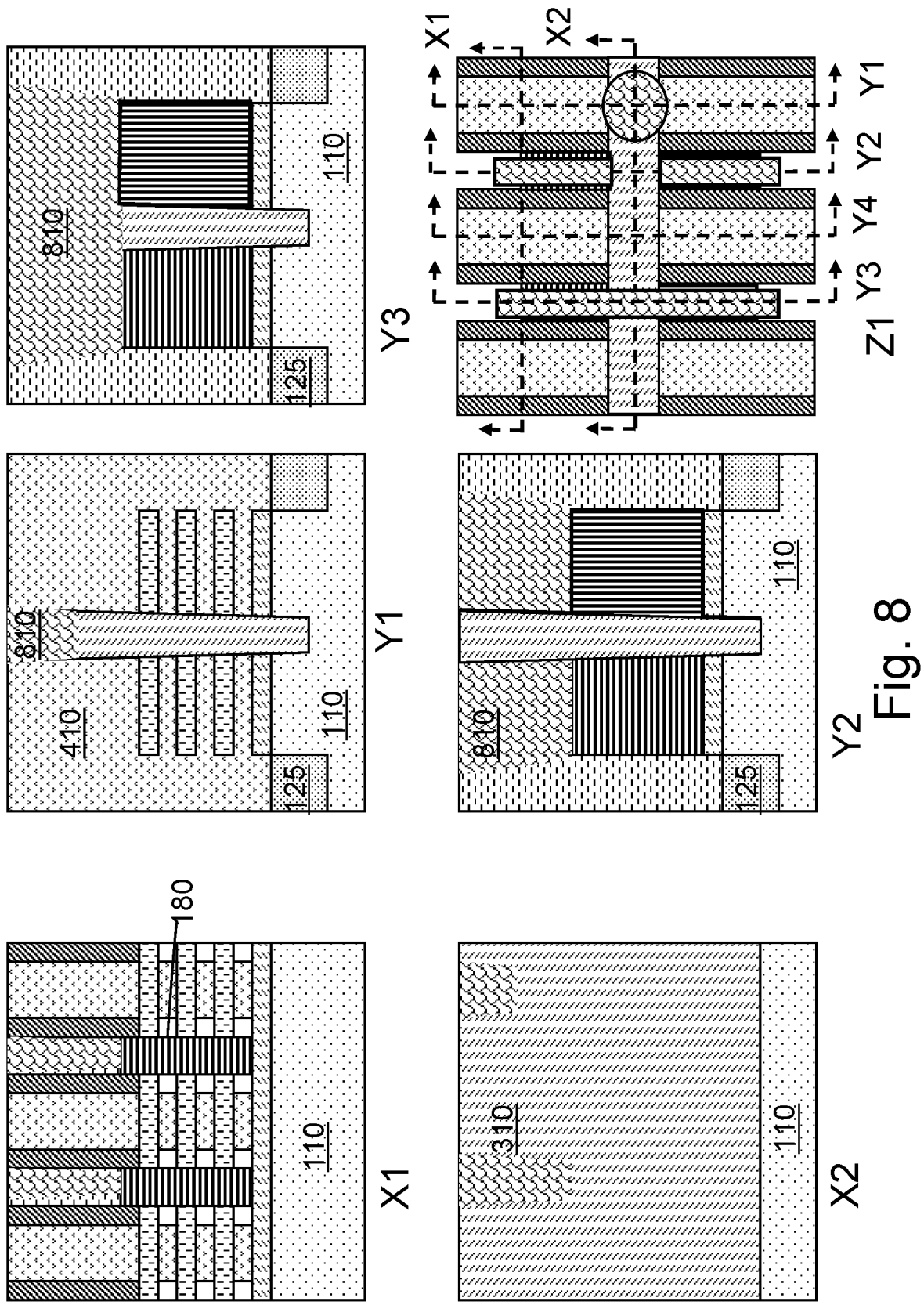
FIG. 8 provides cross-sectional views of a step in the fabrication of a semiconductor device, according to an embodiment of the invention. The figure illustrates the device after formation of metal contacts in each of the first, second, and third contact openings.

FIG. 8 illustrates the device following formation of contact metallization 810, to fill the first, second and third contact openings formed in the device. Contact formation results in common S/D contacts for the NMOS and PMOS devices, independent S/D contacts for each of the NMOS and PMOS devices, and linked gate contacts for the NMOS and PMOS devices.

As shown in FIG. 8, a trench metal deposition process yields a metallized layer 810 adjacent to and above the S-D regions 180, 185, and dielectric spacer 310. In an embodiment, formation of the trench metal layer 810 includes forming a silicide layer between contact and epitaxial grown S/D regions 180, 185, (e.g., Ni silicide, Ti silicide, NiPt silicide, Co silicide, etc.) followed by forming metallization materials above the silicide (e.g., a thin adhesion metal such as TiN and a bulk metal fill such as Co, W, Ru, etc., followed by CMP.

Figure 9A:
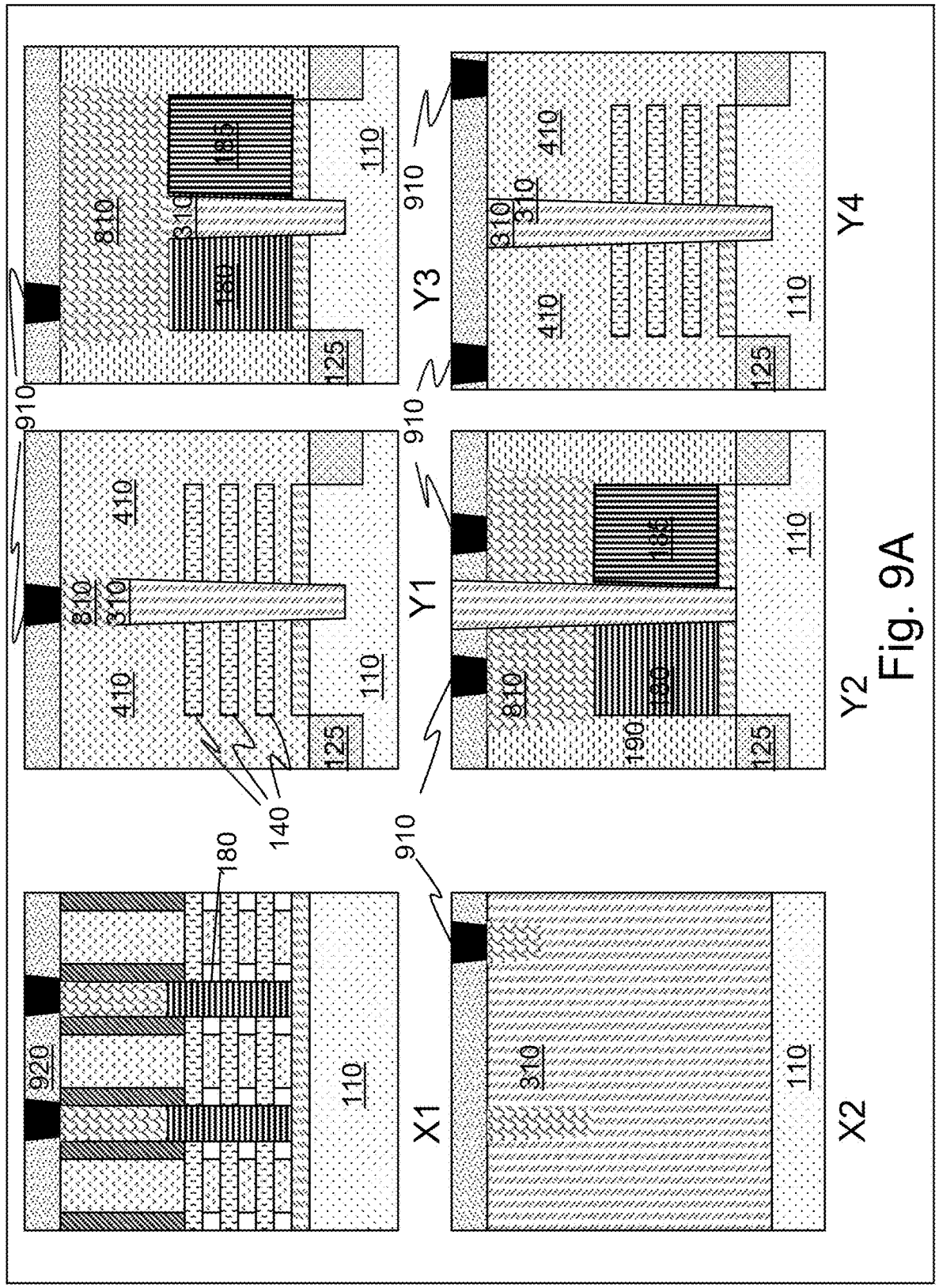
FIG. 9A provides cross-sectional views of a step in the fabrication of a semiconductor device, according to an embodiment of the invention. The figure illustrates the device after formation of upper contacts for the device gate and source/drain contacts.
Figure 9B:
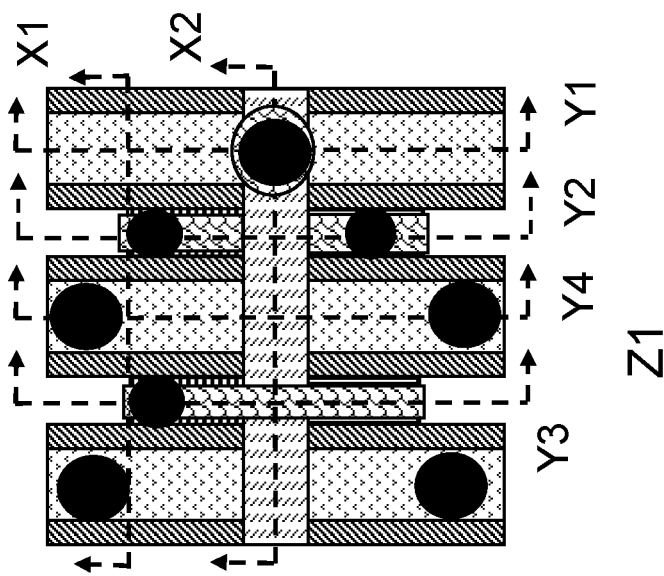
FIG. 9B provides cross-sectional views of a step in the fabrication of a semiconductor device, according to an embodiment of the invention. The figure illustrates the device after formation of upper contacts for the device gate and source/drain contacts.

FIGS. 9A and 9B illustrate the device following deposition of ILD material 920, such as SiO2, SiN, SiOC, and combinations of these, formation of contact vias through the ILD material 920, and metallization of the contact vias to form upper device contacts 910 for both source/drain and gates. Contact metallization proceeds as described with regard to device contacts 810. The Z1 view illustrates upper device contacts 910 without ILD material 920 obstructing the view of underlying device elements.

Figure 10:
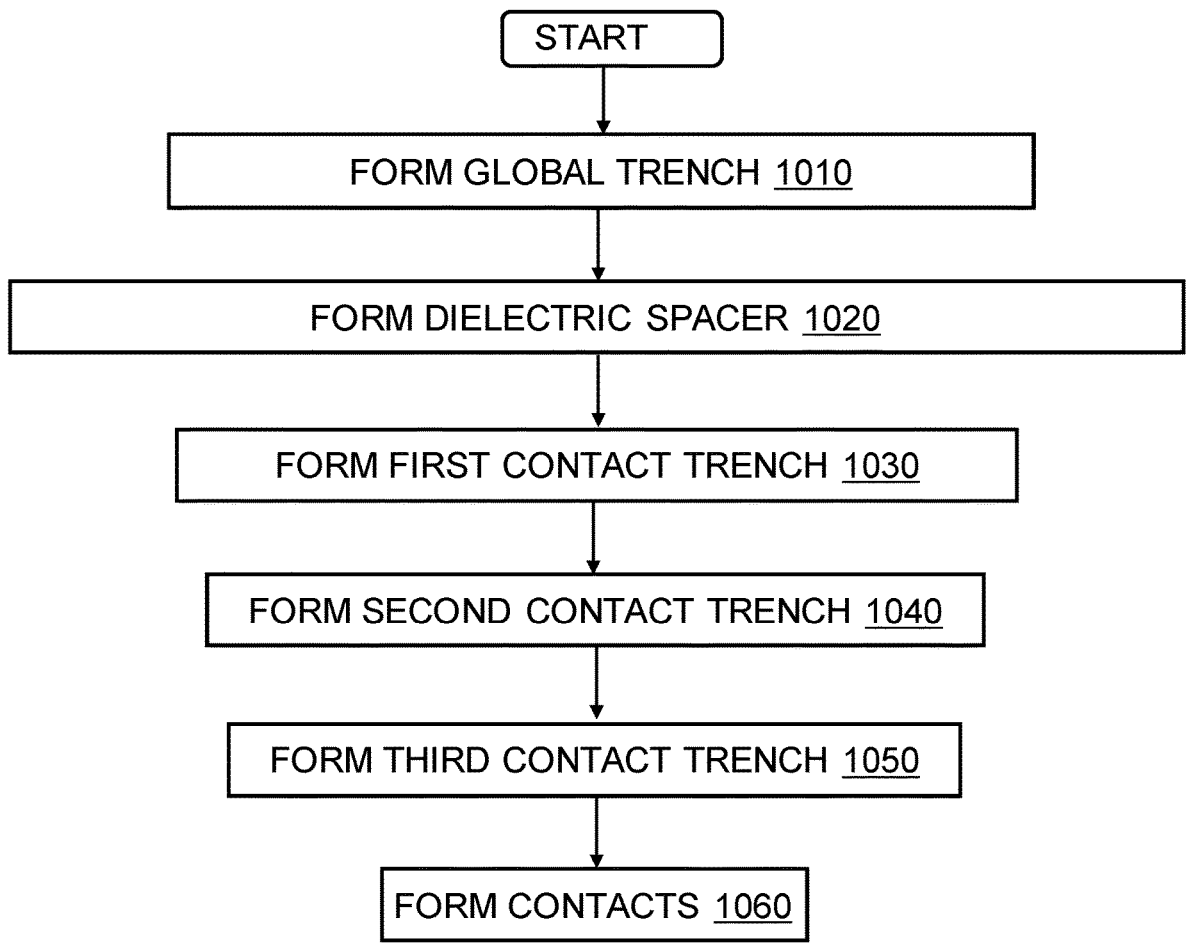
FIG. 10 provides a flowchart depicting operational steps for forming semiconductor device, according to an embodiment of the invention.

FIG. 10 provides flowchart 1000 listing operational steps associated with fabrication of semiconductor devices according to an embodiment of the invention. At block 1010, the method forms a global cut perpendicular to the dummy gate structures of the device. The global cut separates the NMOS and PMOS portions of the device. At block 1020, the method fills the global cut with a dielectric spacer material. This dielectric spacer material differs from the interlayer dielectric material encapsulating the NMOS and PMOS portions of the device. High-k metal gates replace dummy gates following formation of the dielectric spacer in the global cut. Deposition of a dielectric cap layer above the HKMG occurs following HKMG formation.

At block 1030, the method forms a first contact opening, parallel to the gate structures of the device. This trench is non-selective and results in removal of both ILD and dielectric spacer material, exposing the source/drain regions of the NMOS and PMOS devices.

At block 1040, the method forms a second contact opening through the ILD material exposing the source/drain regions of the NMOS and PMOS devices. This contact opening selectively removes only the ILD material, leaving the dielectric spacer material intact between the NMOS and PMOS devices.

At block 1050, the method forms a third contact opening through the upper portion of the dielectric spacer between NMOS and PMOS gate portions. At block 1160, the method forms metallized contacts in the first, second, and third contact openings of the device. These metallized contacts provide common S/D contacts for the NMOS and PMOS devices, independent contacts for each of the PMOS and NMOS S/D regions, and linked gate contacts for the NMOS and PMOS devices. The dielectric spacer provides independent gate contacts for the PMOS and NMOS devices. Following formation of the metallized contacts, upper-level device contacts are formed above the metallized contacts in the upper dielectric layer. Additional fabrication steps occur downstream from the disclosed fabrication steps including the addition of external contacts and final device packaging steps.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A CMOS (complementary metal-oxide semiconductor) device comprising:
   an n-channel metal-oxide semiconductor (NMOS) device;
   a p-channel metal-oxide semiconductor (PMOS) device, the NMOS and the PMOS device surrounded by a first dielectric material, the NMOS device separated from the PMOS device by a second dielectric material;
   a first NMOS gate separated from a first PMOS gate by the second dielectric material;

a second NMOS gate electrically connected to a second PMOS gate by a metal link disposed between the second NMOS gate and the second PMOS gate, the metal link disposed above the second dielectric material;

a first source/drain (S/D) contact disposed above the second dielectric material, the first S/D contact disposed in contact with both an NMOS S/D region and a PMOS S/D region; and a second S/D contact disposed adjacent to the second dielectric material, the second S/D contact disposed in contact with a first single S/D region.

2. The CMOS device according to claim 1, further comprising a third S/D contact disposed adjacent to the second dielectric material, the third S/D contact disposed in contact with a second single S/D region.

3. The CMOS device according to claim 1, further comprising a third S/D contact disposed adjacent to the second dielectric material, the third S/D contact disposed in contact with a second PMOS S/D region.

4. The CMOS device according to claim 1, wherein the CMOS device comprises tri-gate channels, wherein one edge of a channel is disposed in contact with the second dielectric material.

5. The CMOS device according to claim 1, wherein the CMOS device comprises nanosheet channels.

6. The CMOS device according to claim 1, further comprising upper gate contacts.

7. The CMOS device according to claim 1, further comprising upper S/D contacts.

8. A CMOS (complementary metal-oxide semiconductor) device comprising:

an n-channel metal-oxide semiconductor (NMOS) device;

a p-channel metal-oxide semiconductor (PMOS) device, the NMOS and the PMOS device surrounded by a first dielectric material, the NMOS device separated from the PMOS device by a second dielectric material;

a first NMOS gate separated from a first PMOS gate by the second dielectric material;

a second NMOS gate electrically connected to a second PMOS gate by a metal link disposed between the second NMOS gate and the second PMOS gate, the metal link disposed above the second dielectric material;

a first source/drain (S/D) contact disposed above the second dielectric material, the first S/D contact disposed in contact with both an NMOS S/D region and a PMOS S/D region;

a second S/D contact disposed adjacent to the second dielectric material, the second S/D contact disposed in contact with a single S/D region; and a third S/D contact disposed adjacent to the second dielectric material, the third S/D contact disposed in contact with a single S/D region.

9. The CMOS device according to claim 8, further comprising the third S/D contact disposed adjacent to the second dielectric material, the third S/D contact disposed in contact with a second PMOS S/D region.

10. The CMOS device according to claim 8, wherein the CMOS device comprises tri-gate channel contacts wherein a channel edge is disposed in contact with the second dielectric material.

11. The CMOS device according to claim 8, wherein the CMOS device comprises nanosheet channels.

12. The CMOS device according to claim 8, further comprising upper gate contacts.

13. The CMOS device according to claim 8, further comprising upper S/D contacts.

* * * * *